(12) United States Patent
Ajiki

(10) Patent No.: US 7,382,022 B2
(45) Date of Patent: Jun. 3, 2008

(54) SEMICONDUCTOR DEVICE AND BOOST CIRCUIT

(75) Inventor: Yoshiharu Ajiki, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 126 days.

(21) Appl. No.: 11/373,915

(22) Filed: Mar. 14, 2006

(65) Prior Publication Data
US 2006/0214228 A1    Sep. 28, 2006

(30) Foreign Application Priority Data
Mar. 23, 2005   (JP) ............................. 2005-083391

(51) Int. Cl.
| H01L 27/01 | (2006.01) |
| H01L 27/12 | (2006.01) |
| H01L 31/0392 | (2006.01) |
| G05F 1/10 | (2006.01) |
| G05F 3/02 | (2006.01) |

(52) U.S. Cl. .................. 257/347; 327/536; 327/537
(58) Field of Classification Search ................ 257/347; 365/185.25; 327/535–537
See application file for complete search history.

(56) References Cited

U.S. PATENT DOCUMENTS

| 6,278,316 | B1 * | 8/2001 | Tanzawa et al. ............ 327/536 |
| 2002/0125935 | A1 * | 9/2002 | Sawada et al. ............. 327/536 |
| 2006/0290413 | A1 * | 12/2006 | Ajiki .......................... 327/536 |
| 2007/0273431 | A1 * | 11/2007 | Sakurai et al. ............. 327/537 |

FOREIGN PATENT DOCUMENTS

JP   A 2004-328901   11/2004

* cited by examiner

Primary Examiner—Anh Phung
Assistant Examiner—Allison P Bernstein
(74) Attorney, Agent, or Firm—Oliff & Berridge, PLC

(57) ABSTRACT

A semiconductor device includes a transistor that is used for a charge pump circuit, being configured with a fully depleted silicon-on-insulator transistor.

3 Claims, 4 Drawing Sheets

SEMICONDUCTOR DEVICE AND BOOST CIRCUIT

BACKGROUND

1. Technical Field

The present invention relates to a semiconductor device and a boost circuit, particularly to the ones suitable for configuration of a charge pump circuit with a fully depleted silicon-on-insulator (hereafter "SOI") transistor.

2. Related Art

In common semiconductor devices, field-effect transistors are formed on SOI substrates. This is because these transistors are latch-up free and are easy to isolate devices therein, and have a comparatively small source/drain junction capacitance. Particularly, since fully depleted SOI transistors allow rapid, lower power-consumption operations, researches for achieving the operation of the SOI transistors in a fully depleted mode are very active.

As semiconductor manufacturing processes advance, semiconductor integrated circuits become more multifunctional and highly integrated in a higher density, while the source voltage inside those semiconductor integrated circuits become lower and lower. Various power sources, including high voltage sources, are more often built in, as semiconductor integrated circuits become more multifunctional. For instance, 10V and/or more of high voltage is required for nonvolatile memories such as flash memory and electrically erasable programmable read-only memory (hereafter "EEPROM"), and for driver integrated circuits (hereafter "IC") for display devices. In order to generate such high voltages with a boost circuit, a charge pump approach with which building-in the boost circuit to the semiconductor circuit is easy, is employed, instead of a switching regulator approach using coils and the like. Among the charge pump approach, Dickson charge pump circuit is commonly used, as disclosed in JP-A-2004-328901.

However, in common charge pump circuits, ground contact of substrate terminals of transistors needs to be provided in order to deal with the latch-up phenomenon. This involved a problem of conversion efficiency deterioration, since transistors that configure the charge pumps need to be high voltage proof, which increases an internal impedance of charge pump circuits.

SUMMARY

An advantage of the invention is to provide a semiconductor device and a boost circuit that can improve the conversion efficiency during the boosting, while preventing the latch-up.

According to an aspect of the invention, a semiconductor device includes a transistor used for a charge pump circuit, being configured with a fully depleted silicon-on-insulator transistor.

This allows the complete electric isolation of the transistor used in the charge pump circuit, thereby preventing the latch-up without using high voltage transistors. Consequently, the charge pump circuit may be configured using a transistor with the high transconductance, thereby reducing the internal impedance of the charge pump circuit. As a result, this allows the improvement of the conversion efficiency during the boosting, and the various power sources including high voltage sources may be built in to the semiconductor integrated circuit, while maintaining being compatibility with the increasingly low source voltage within the semiconductor integrated circuit.

In this case, in the semiconductor device, the fully depleted silicon-on-insulator may include: a semiconductor layer formed on an insulation layer; a gate electrode arranged on the semiconductor layer; a source layer formed on the semiconductor layer, arranged on one side of the gate electrode; a drain layer formed on the semiconductor layer, arranged on the other side of the gate electrode; and a body-source junction layer which connects a body region under the gate electrode and the source layer.

Here, since the SOI transistor is fully depleted, the hot carriers accumulated in the body region may be let out while suppressing a device area increase, in the case where the body region under the gate electrode is isolated. Consequently, this allows a prevention of drain deterioration caused by the accumulation of the hot carrier in the body region, thereby attaining a lower power consumption and low-power drive, while improving the conversion efficiency of the charge pump circuit.

According to another aspect of the invention, a booster circuit includes: a first n-channel fully depleted silicon-on-insulator transistor in which a first pulse is emitted into a gate; a first p-channel fully depleted silicon-on-insulator transistor in which the first pulse is emitted into a gate, connected serially to the first n-channel fully depleted silicon-on-insulator transistor; a second n-channel fully depleted silicon-on-insulator transistor where a gate thereof is connected to a drain of the first n-channel fully depleted transistor; a second p-channel fully depleted silicon-on-insulator transistor, connected serially to the second n-channel fully depleted silicon-on-insulator transistor; a third p-channel fully depleted silicon-on-insulator transistor in which a second pulse which is in an opposite phase to the first pulse is emitted into a gate, a source thereof is connected to a drain of the second n-channel fully depleted silicon-on-insulator transistor; a third n-channel fully depleted silicon-on-insulator transistor in which the second pulse is emitted into a gate, connected serially to the third p-channel fully depleted silicon-on-insulator transistor, and a source thereof being connected to a source of the second n-channel fully depleted silicon-on-insulator transistor; a forth n-channel fully depleted silicon-on-insulator transistor where a source thereof is connected to the source of the second n-channel fully depleted silicon-on-insulator transistor, and where a gate thereof is connected to a drain of the third n-channel fully depleted transistor; a forth p-channel fully depleted silicon-on-insulator transistor which is connected serially to the forth n-channel fully depleted silicon-on-insulator transistor, a gate thereof being connected to a source of the third p-channel fully depleted silicon-on-insulator transistor, a source thereof being connected to the source of the second p-channel fully depleted silicon-on-insulator transistor, and a drain thereof being connected to a source of the first p-channel fully depleted silicon-on-insulator transistor; a first capacitor to which the first pulse is input, connected to the drain of the second n-channel fully depleted silicon-on-insulator transistor; and a second capacitor to which the second pulse is input, connected to a drain of the forth n-channel fully depleted silicon-on-insulator transistor.

Hence the transistors used in the charge pump circuit may be configured with the fully depleted SOI transistors, allowing a complete electric isolation of these transistors. Consequently, the latch-up may be prevented without using the high voltage transistors, and the internal impedance of the charge pump circuit may be reduced, thereby allowing the improvement of the conversion efficiency of the charge pump circuit.

In this case, in the booster circuit, the n-channel fully depleted silicon-on-insulator transistors and the p-channel fully depleted silicon-on-insulator transistors may have a source-tie structure.

Therefore, in the case where the holes, generated in the drain edge, flows into the body region, those holes accumulated in the body region may be drained to the source, thereby allowing the suppression of the hot carrier accumulation in the body region. Consequently, since the SOI transistor is fully depleted, the drain deterioration may be prevented while suppressing an device area increase, in the case where the body region under the gate electrode is isolated.

It this case, in this boost circuit, a lower electrode for any one of the first and the second capacitors is configured with a p-doped diffusion layer which constitutes the source/drain of any one of the first through fourth p-channel fully depleted silicon-on-insulator transistors, and wherein an upper electrode for any one of the first and the second capacitors is configured with a polysilicon layer constituting a gate for any one of the first through fourth p-channel fully depleted silicon-on-insulator transistors.

Consequently, the first and the second capacitors may be formed together with the formation of the first through forth p-channel fully depleted SOI transistors, configuring the charge pump circuit while preventing the complication of the manufacturing process.

BRIEF DESCRIPTION OF THE DRAWINGS

The invention will be described with reference to the accompanying drawings, wherein like numbers reference like elements.

DESCRIPTION OF EXEMPLARY EMBODIMENTS

A semiconductor device and a boost circuit in accordance with an embodiment of the invention will now be described with references to the accompanying drawings.

Figure 1:
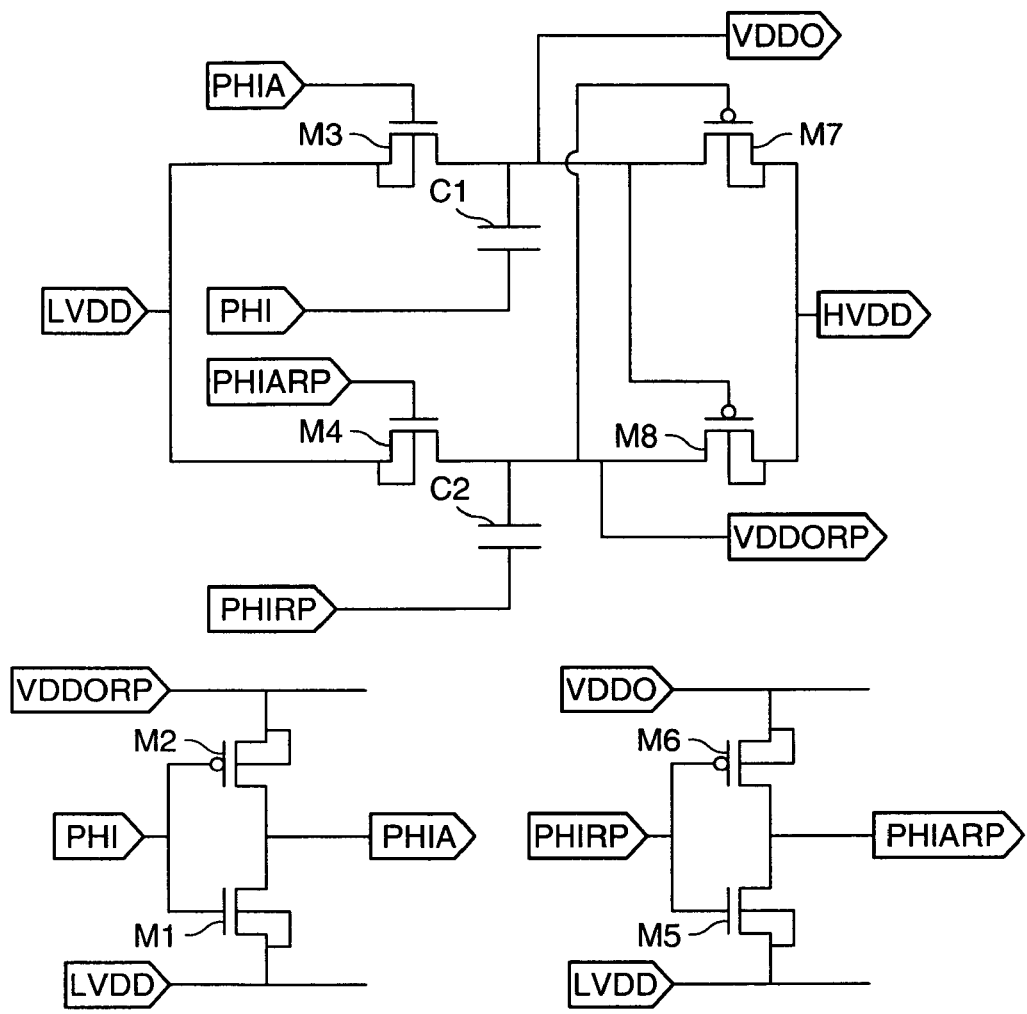
FIG. 1 is a circuit diagram showing an exemplary structure of one step-up operation of a boost circuit to which the invention is applied.

FIG. 1 is a circuit diagram showing an exemplary structure of a boost circuit to which the invention is applied.

In FIG. 1, a source of an n-channel field-effect transistor M1 is connected to a LVDD terminal, and the source of a p-channel field-effect transistor M2 is connected to a VDDORP terminal. A drain of the n-channel field-effect transistor M1 and the drain of the p-channel field-effect transistor M2 are both connected to a PHIA terminal. Further, the gate of the n-channel field-effect transistor M1 and the gate of the p-channel field-effect transistor M2 are both connected to a PHI terminal. Here, a substrate potential of the n-channel field-effect transistor M1 is connected to the source of the n-channel field-effect transistor M1, and the substrate potential of the p-channel field-effect transistor M2 is connected to the source of the p-channel field-effect transistor M2.

The source of an n-channel field-effect transistor M5 is connected to the LVDD terminal, and the source of a p-channel field-effect transistor M6 is connected to a VDDO terminal. The drain of the n-channel field-effect transistor M5 and the drain of the p-channel field-effect transistor M6 are both connected to a PHIARP terminal. Further, the gate of the n-channel field-effect transistor M5 and the gate of the p-channel field-effect transistor M6 are both connected to a PHIRP terminal. Here, the substrate potential of the n-channel field-effect transistor M5 is connected to the source of the n-channel field-effect transistor M5, and the substrate potential of the p-channel field-effect transistor M6 is connected to the source of the p-channel field-effect transistor M6.

The sources of n-channel field-effect transistors M3 and M4 are connected to the LVDD terminal, and sources of p-channel field-effect transistors M7 and M8 are connected to a HVDD terminal. The drain of the n-channel field-effect transistor M3 and the drain of p-channel field-effect transistor M7 are both connected to the VDDO terminal, and the drain of the n-channel field-effect transistor M4 and the drain of the p-channel field-effect transistor M8 are both connected to the VDDORP terminal. The gate of the n-channel field-effect transistor M3 is connected to the PHIA terminal, and the gate of the n-channel field-effect transistor M4 is connected to the PHIARP terminal. The gate of the p-channel field-effect transistor M7 is connected to the VDDORP terminal, and the gate of the p-channel field-effect transistor M8 is connected to the VDDO terminal.

Here, the substrate potential of the n-channel field-effect transistor M3 is connected to the source of the n-channel field-effect transistor M3, and the substrate potential of the n-channel field-effect transistor M4 is connected to the source of the n-channel field-effect transistor M4. Moreover, the substrate potential of the p-channel field-effect transistor M7 is connected to the source of the p-channel field-effect transistor M7, and the substrate potential of the p-channel field-effect transistor M8 is connected to the source of the p-channel field-effect transistor M8.

The PHI terminal is connected to the drain of the n-channel field-effect transistor M3 via a capacitor C1, and the PHIRP terminal is connected to the drain of the n-channel field-effect transistor M4, via a capacitor C2.

Figure 2:
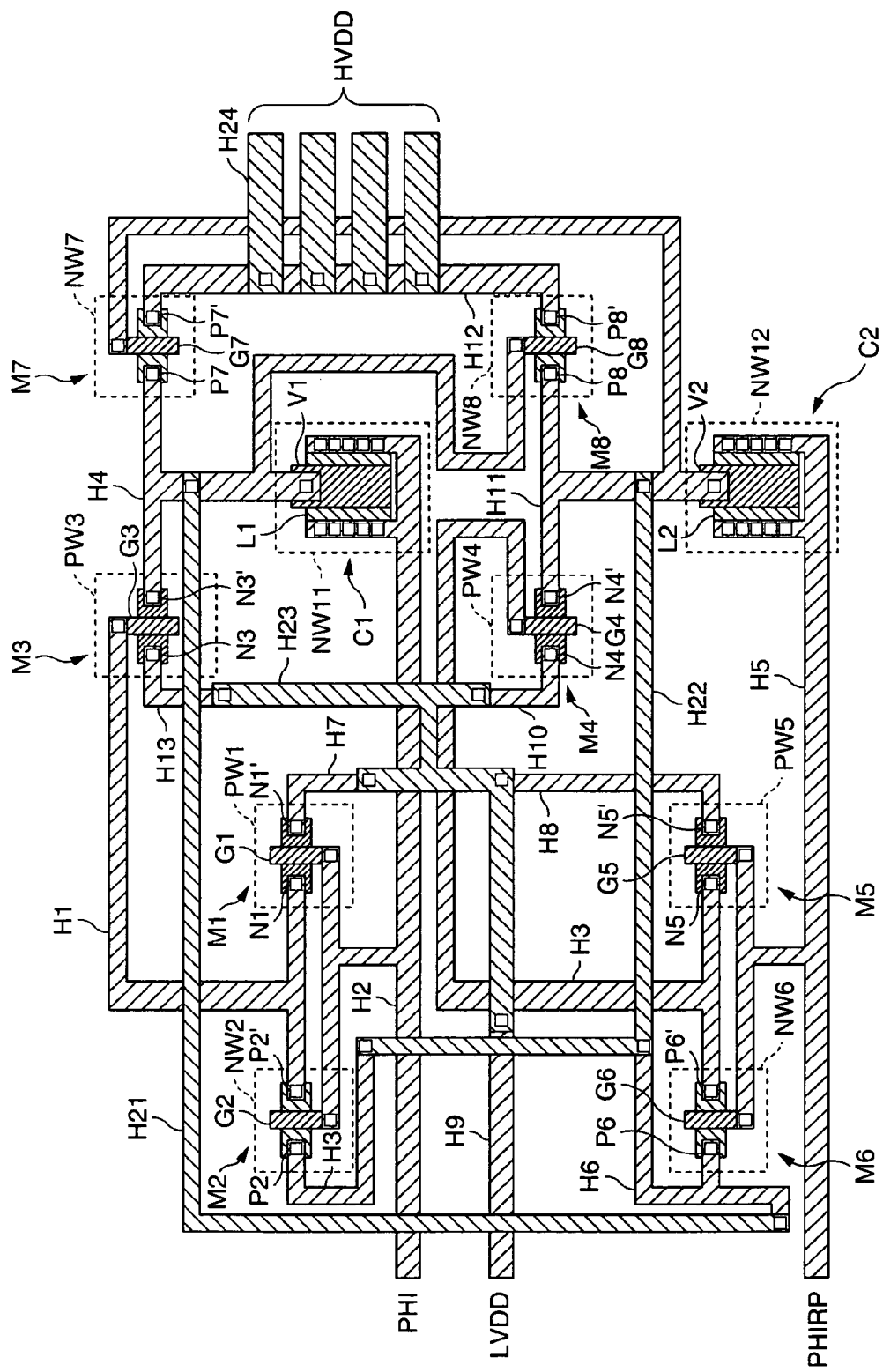
FIG. 2 is a top view drawing showing a layout pattern of the boost circuit in FIG. 1.

FIG. 2 is a top view drawing showing a layout pattern of the boost circuit in FIG. 1.

N-wells NW2, NW6, NW7, NW8, NW11, NW12, and p-wells PW1, PW3, PW4, PW5 are installed on the semiconductor substrate referred to in FIG. 2. The n-channel field-effect transistors M1, M3, M4, and M5 referred to in FIG. 1 are formed in p-wells PW1, PW3, PW4, and PW5 respectively, and the p-channel field-effect transistors M2, M6, M7, and M8 referred to in FIG. 1 are formed in the n-wells NW2, NW6, NW7, and NW8 respectively. The capacitors C1 and C2 referred to in FIG. 1 are respectively formed in the n-wells NW11 and NW12.

A gate electrode G1 is arranged on the p-well PW1, and in this p-well PW1, n-type impurity diffused layers N1 and N1' are formed so as to sandwich the gate electrode G1. A gate electrode G3 is arranged on the p-well PW3, and in this p-well PW3, n-type impurity diffused layers N3 and N3' are formed so as to sandwich the gate electrode G3. A gate electrode G4 is arranged on the p-well PW4, and in this p-well PW4, n-type impurity diffused layers N4 and N4' are formed so as to sandwich the gate electrode G4. A gate electrode G5 is arranged on the p-well PW5, and in the p-well PW5, n-type impurity diffused layers N5 and N5' are formed so as to sandwich the gate electrode G5.

A gate electrode G2 is arranged on the n-well NW2, and in this n-well NW2, p-type impurity diffused layers P2 and P2' are formed so as to sandwich the gate electrode G2. A gate electrode G6 is arranged on the n-well NW6, and in this n-well NW6, p-type impurity diffused layers P6 and P6' are formed so as to sandwich the gate electrode G6. A gate electrode G7 is arranged on the n-well NW7, and in this n-well NW7, p-type impurity diffused layers P7 and P7' are formed so as to sandwich the gate electrode G7. A gate electrode G8 is arranged on the n-well NW8, and in this n-well NW8, p-type impurity diffused layers P8 and P8' are formed so as to sandwich the gate electrode G8.

An upper electrode U1 is arranged on the n-well NW11, and in the n-well NW11, a p-type impurity diffused layer L1 is formed so as to face the upper electrode U1. An upper electrode U2 is arranged on the n-well NW12, and in the n-well NW12, a p-type impurity diffused layer L2 is formed so as to face the upper electrode U2.

The n-type impurity diffused layer N1, the p-type impurity diffused layer P2' and the gate electrode G3 are interconnected via a lower metallization layer H1. The gate electrodes G1, G2, the p-type impurity diffused layer L1, and the PHI terminal are interconnected via a lower metallization layer H2. The n-type impurity diffused layer N5, the p-type impurity diffused layer P6', and the gate electrode G4 are interconnected via a lower metallization layer H3. The n-type impurity diffused layer N3', the p-type impurity diffused layer P7, the gate electrode G8, and the upper electrode U1 are interconnected via a lower metallization layer H4. The gate electrodes G5, G6, the p-type impurity diffused layer L2, and the PHIRP terminal are interconnected via a lower metallization layer H5. The p-type impurity diffused layer P6 is connected to a lower metallization layer H6. The n-type impurity diffused layer N1' is connected to a lower metallization layer H7. The n-type impurity diffused layer N5' is connected to a lower metallization layer H8. The LVDD terminal is connected to a lower metallization layer H9. The n-type impurity diffused layer N4 is connected to a lower metallization layer H10. The n-type impurity diffused layer N4', the p-type impurity diffused layer P8, the gate electrode G7, and the upper electrode U2 are interconnected via a lower metallization layer H11. The p-type impurity diffused layers P7' and P8' are interconnected via a lower metallization layer H12. The n-type impurity diffused layer N3 is connected to the circuit via a lower metallization layer H13.

The lower metallization layers H4 and H6 are interconnected via an upper metallization layer H21. The lower metallization layers H3, H6, and H11 are interconnected via an upper metallization layer H22. The lower metallization layers H7, H8, H9, H10, and H13 are interconnected via an upper metallization layer H23. The lower metallization layer H12 is connected to the circuit via an upper metallization layer H24.

Here, the n-channel field-effect transistors M1, M3, M4, M5, and the p-channel field-effect transistors M2, M6, M7, M8 may be configured with the fully depleted SOI transistors.

Here, the n-channel field-effect transistors M1, M3, M4, M5, and the p-channel field-effect transistors M2, M6, M7, M8 may be in a complete electric isolation; hence the latch-up may be prevented without using the high voltage transistors. Consequently, the n-channel field-effect transistors M1, M3, M4, M5, and the p-channel field-effect transistors M2, M6, M7, M8, all of which have high transconductance, may be used to configure the charge pump circuit, thereby allowing to reduce the internal impedance therein. As a result, this allows the improvement of the conversion efficiency during the boosting, and the various power sources including high voltage sources may be built into the semiconductor integrated circuit, while maintaining compatibility with the increasingly low source voltage within the semiconductor integrated circuit.

By using the source-tie structured fully depleted SOI transistors for the n-channel field-effect transistors M1, M3, M4, M5 and the p-channel field-effect transistors M2, M6, M7, M8, the device area may be reduced, since there is no need to pattern the back gate terminals for grounding the substrate on which the transistors are formed, around the n-wells NW2, NW6, NW7, NW8, NW11, NW12, and the p-wells PW1, PW3, PW4, PW5.

Aluminum may be used for the lower metallization layers H1 through H13, and the upper metallization layers H21 through H24. The gate electrodes G1 through G8 and the upper electrodes U1 and U2 may be composed with polysilicon layer, and the p-type impurity diffused layers L1 and L2 may be used as the lower electrodes of the capacitors C1 and C2.

Consequently, the capacitors C1 and C2 may be formed together with the formation of the p-channel field-effect transistors M2, M6, M7, and M8, thereby configuring the charge pump circuit while preventing the complication of the manufacturing process.

Figure 3A:
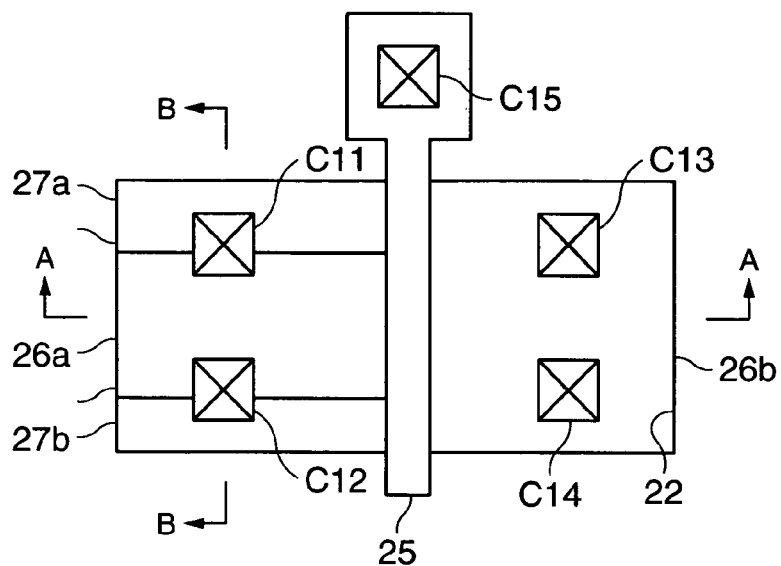
FIGS. 3A to 3C are sectional drawings showing an exemplary structure of a fully depleted SOI transistor.
Figure 3B:
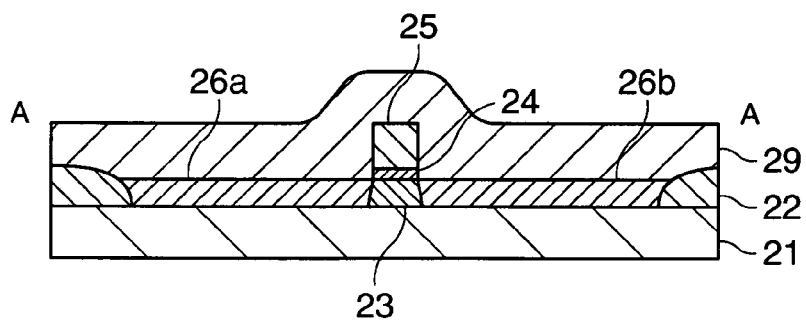

FIGS. 3A to 3B are sectional drawings showing an exemplary structure of a fully depleted SOI transistor that has the source-tie structure.

In FIGS. 3A to 3B, a single-crystal semiconductor layer 23 is formed on an insulation layer 21, and the single-crystal semiconductor layer 23 is separated with a device isolation insulation film 22. Examples of material for the single-crystal semiconductor layer 23 include: Si, Ge, SiGe, SiC, SiSn, PbS, GaAs, InP, GaP, GaN, and ZnSe. An insulation layer or a buried insulation layer with materials such as $SiO_2$, SiON, and $Si_3N_4$ may be used for the insulation layer 21. An SOI substrate, for instance, may be used as a supporting substrate that supports the insulation layer where the single-crystal semiconductor layer 23 is formed. Examples of substrates used for SOI substrate include: a Separation by Implanted Oxygen (SIMOX) substrate, an adhered substrate, and a laser annealed substrate. Insulation substrates formed with sapphire, glass, or ceramic may also be used for the supporting substrate. A gate electrode 25 is formed on the single-crystal semiconductor layer 23 via a gate insulation film 24. A source layer 26a and a drain layer 26b are also formed on the single-crystal semiconductor layer 23, arranged on each side of the gate electrode 25. As shown in FIG. 3B, the bottom of the source layer 26a and the drain layer 26b both make contact with the insulation layer 21, and the body region under the gate electrode 25 is isolated between the source layer 26a and the drain layer 26b.

Body-source connection layers 27a and 27b are formed on the single-crystal semiconductor layer 23 that is on the side of the source layer 26a, arranged so as to sandwich the source layer 26a, touching the body region under the gate electrode 25. An interlayer insulation film 29 is formed on the single-crystal semiconductor layer 23 on which the gate electrode 25 is formed. Source contacts C11 and C12 are formed on the source layer 26a side, so as to make contact with the source layer 26a and the body-source connection layers 27a and 27b.

Figure 3C:
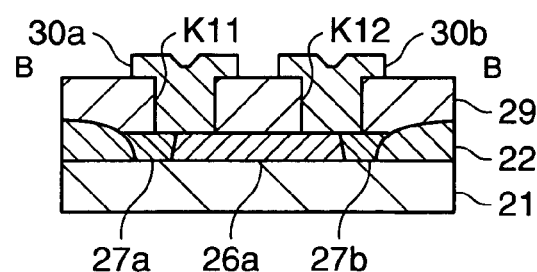
Figure 4A:
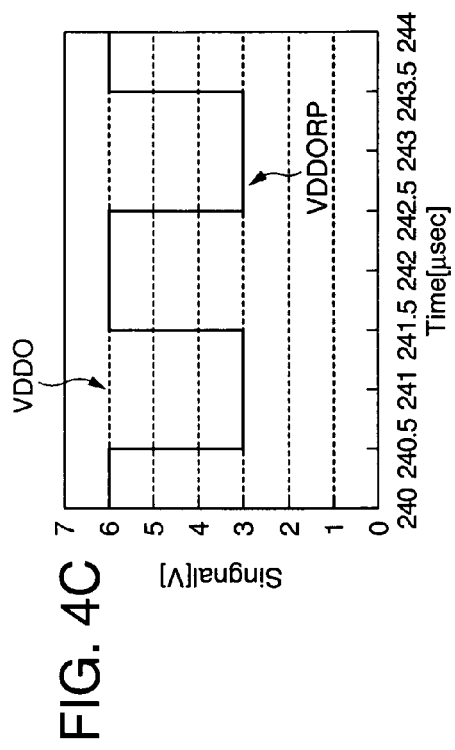
FIGS. 4A to 4D is a pattern diagram showing an output waveform of the boost circuit in FIG. 1.
Figure 4C:
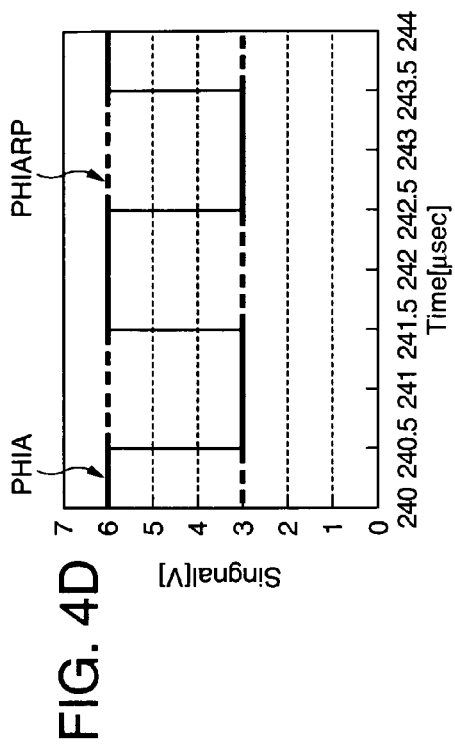
Figure 4B:
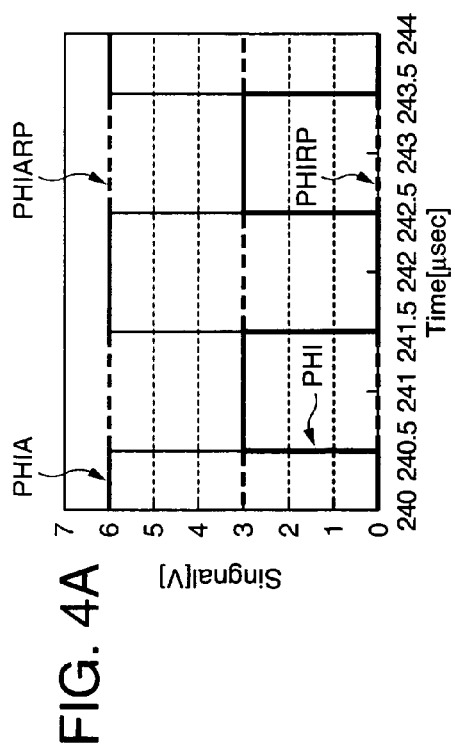
Figure 4D:
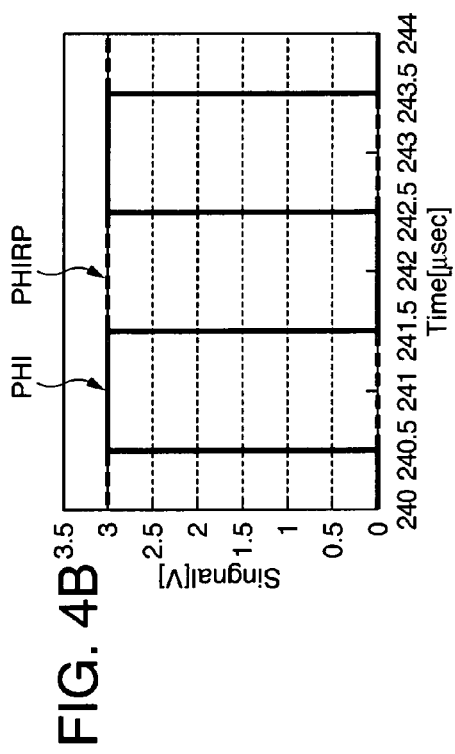

Contact holes K11 and K12 are formed in the interlayer insulation film 29, as shown in FIG. 3C, arranged so that they cover the border between the source layer 26a and the body-source connection layer 27a, as well as between the source layer 26a and the body-source connection layer 27b. The source layer 26a and the body-source connection layers 27a and 27b are respectively connected to source metal layers 30a and 30b through the contact holes K11 and K12.

A gate contact C15 is formed on the gate electrode 25 in order to make contact with it, and drain contacts C13 and C14 are formed on the drain layer 26b in order to contact it.

Here, if the n-channel transistor is formed on the single-crystal semiconductor layer 23, then the single-crystal semiconductor layer 23 and the body-source connection layers 27a and 27b are configured to p-type, and the source layer 26a and the drain layer 26b are configured to n$^+$type.

Therefore, in the case where the holes, generated in the drain edge, flow into the body region, they may be released/drained to the source metal layers 30a and 30b through the body-source connection layers 27a and 27b, thereby allowing the suppression of the hot carrier accumulation in the body region.

Consequently, since the SOI transistor is fully depleted, the drain deterioration caused by the hot carrier accumulation in the body region may be prevented while suppressing an area increase of parts, in the case where the body region under the gate electrode is isolated.

FIG. 4 is a pattern diagram showing an output waveform of the boost circuit in FIG. 1.

Here, for example, pulse signals with a duty ratio of 0.5 and an amplitude of 3V are input to the PHI terminal, and signals that are opposite phase to the ones input to the PHI terminal are input to the PHIRP terminal. Further, the pulse signals with a duty ratio of 0.5 and an amplitude of 3V are input to the PHIA terminal, and signals that are opposite phase to the ones input to the PHIA terminal is input to the PHIARP terminal. Moreover, the LVDD terminal is 3V, and the HVDD terminal is 6V, for instance. Still further, a 3V equivalent charge is accumulated on the capacitor C2, and no charge is accumulated in the capacitor C1.

Subsequently, if the potential of the PHI terminal becomes 0V, then the n-channel field-effect transistor M1 is switched off, and the p-channel field-effect transistor M2 is switched on. If the potential of the PHI terminal becomes 0V, then the potential of the PHIRP terminal becomes 3V; thus the potential of the capacitor C2 is pushed up by 3V, and the potential of the VDDORP terminal becomes 6V. If the potential of the VDDORP terminal is 6V, the potential of the PHIA terminal becomes 6V since the p-channel field-effect transistor M2 is switched on, and the n-channel field-effect transistor M3 is switched on. Thereafter, when the n-channel field-effect transistor M3 is switched on, the potentials of the LVDD terminal and the PHI terminal are 3V and 0V respectively; hence the potential of the VDDO terminal becomes 3V and a voltage of 3V is applied to the capacitor C1, thereby accumulating the 3V equivalent charge. If the potential of the VDDO terminal is 3V, then the p-channel field-effect transistor M8 is switched on, and the potential of the HVDD terminal becomes 6V.

Subsequently, if the potential of the PHI terminal becomes 3V, then the n-channel field-effect transistor M5 is switched off, and the p-channel field-effect transistor M6 is switched on. If the potential of the PHIRP terminal is 0V, then the potential of the PHI terminal becomes 3V; thus the potential of the capacitor C1 is pushed up by 3V, and the potential of the VDDO terminal becomes 6V. If the potential of the VDDO terminal is 6V, then the potential of the PHIARP terminal becomes 6V since the p-channel field-effect transistor M6 is switched on, and the n-channel field-effect transistor M4 is switched on. Thereafter, when the n-channel field-effect transistor M4 is switched on, the potentials of the LVDD terminal and the PHIRP terminal are 3V and 0V respectively; hence the potential of the VDDORP terminal becomes 3V and a voltage of 3V is applied to the capacitor C2, thereby accumulating the 3V equivalent charge. If the potential of the VDDO terminal is 3V, then the p-channel field-effect transistor M7 is switched on, and the potential of the HVDD terminal becomes 6V.

As a result, a voltage of 6V is obtained by inputting the pulse signal with amplitude of 3V into the boost circuit indicated in FIG. 1. The input voltage may be boosted up by a factor of N, by connecting the boost circuit indicated in FIG. 1 with n-steps. Here, the conversion efficiency of the charge pump circuit is normally in the range of approximately 60 to 70% (inclusive). However, by using the fully depleted SOI transistors for the n-channel field-effect transistors M1, M3, M4, M5, and the p-channel field-effect transistors M2, M6, M7, M8, the conversion efficiency of 80% may be obtained, improving the conversion efficiency. Consequently, a logic circuit and a boost circuit that operate in a low voltage may be packaged in a single chip, so that the logic circuit may be implemented in nonvolatile memories such as EEPROM that require 10V and/or more of high voltage, or in driver ICs for display devices such as liquid crystal. This allows an acceleration of semiconductor integrated circuits to become increasingly multifunctional and to be integrated in a higher density.

What is claimed is:

1. A boost circuit comprising:
   a first n-channel fully depleted silicon-on-insulator transistor in which a first pulse is emitted into a gate;
   a first p-channel fully depleted silicon-on-insulator transistor in which the first pulse is emitted into a gate, connected serially to the first n-channel fully depleted silicon-on-insulator transistor;
   a second n-channel fully depleted silicon-on-insulator transistor where a gate thereof is connected to a drain of the first n-channel fully depleted transistor;
   a second p-channel fully depleted silicon-on-insulator transistor, connected serially to the second n-channel fully depleted silicon-on-insulator transistor;
   a third p-channel fully depleted silicon-on-insulator transistor in which a second pulse which is in an opposite phase to the first pulse is emitted into a gate, a source thereof is connected to a drain of the second n-channel fully depleted silicon-on-insulator transistor;
   a third n-channel fully depleted silicon-on-insulator transistor in which the second pulse is emitted into a gate, connected serially to the third p-channel fully depleted silicon-on-insulator transistor, and a source thereof being connected to a source of the second n-channel fully depleted silicon-on-insulator transistor;
   a fourth n-channel fully depleted silicon-on-insulator transistor where a source thereof is connected to the source of the second n-channel fully depleted silicon-on-insulator transistor, and where a gate thereof is connected to a drain of the third n-channel fully depleted transistor;
   a fourth p-channel fully depleted silicon-on-insulator transistor which is connected serially to the fourth n-channel fully depleted silicon-on-insulator transistor, a gate thereof being connected to a source of the third p-channel fully depleted silicon-on-insulator transistor, a source thereof being connected to the source of the second p-channel fully depleted silicon-on-insulator transistor, and a drain thereof being connected to a source of the first p-channel fully depleted silicon-on-insulator transistor;

a first capacitor to which the first pulse is input, connected to the drain of the second n-channel fully depleted silicon-on-insulator transistor; and a second capacitor to which the second pulse is input, connected to a drain of the fourth n-channel fully depleted silicon-on-insulator transistor.

2. The boost circuit according to claim 1, wherein the first through fourth n-channel fully depleted silicon-on-insulator transistors and the first through fourth p-channel fully depleted silicon-on-insulator transistors each has a source-tie structure.

3. The boost circuit according to claim 1, wherein a lower electrode for any one of the first and the second capacitors is configured with a p-doped diffusion layer that constitutes the source/drain of any one of the first through fourth p-channel fully depleted silicon-on-insulator transistors, and wherein an upper electrode for any one of the first and the second capacitors is configured with a polysilicon layer constituting a gate for any one of the first through fourth p-channel fully depleted silicon-on-insulator transistors.

* * * * *